(12) United States Patent
Yu et al.

(10) Patent No.: US 7,422,970 B2
(45) Date of Patent: Sep. 9, 2008

(54) METHOD FOR MODIFYING CIRCUIT WITHIN SUBSTRATE

(75) Inventors: Wei-Been Yu, Hsinchu (TW); Yung-Shun Liao, Erlun Township, Yunlin County (TW); Hsin-Sheng Liao, Lunbei Township, Yunlin County (TW)

(73) Assignee: Integrated Service Technology Inc., Hsin-Chu (TW)

( * ) Notice: Subject to any disclaimer, the term of this patent is extended or adjusted under 35 U.S.C. 154(b) by 208 days.

(21) Appl. No.: 11/319,621

(22) Filed: Dec. 29, 2005

(65) Prior Publication Data
US 2007/0166842 A1 Jul. 19, 2007

(51) Int. Cl.
*H01L 21/3205* (2006.01)

(52) U.S. Cl. .................. 438/587; 438/48; 438/961; 257/E21.369; 257/E21.052; 257/E29.043; 257/E31.124; 257/E33.062

(58) Field of Classification Search .......... 438/961, 438/48, 587; 257/E23.148, 499, 249, E21.369, 257/E21.052, E29.043, E31.124, E33.062, 257/E39.019; 29/857, 871, 832, 854
See application file for complete search history.

(56) References Cited

U.S. PATENT DOCUMENTS 5,844,168 A * 12/1998 Schueller et al. ............ 174/558
2004/0238910 A1* 12/2004 Fujii et al. .................. 257/433

\* cited by examiner

*Primary Examiner*—Michael S. Lebentritt
*Assistant Examiner*—Chakila Tillie
(74) *Attorney, Agent, or Firm*—Rosenberg, Klein & Lee (57) ABSTRACT

A method is provided for modifying a circuit containing a plurality of electrodes, within a substrate, comprising the steps of: (a) selecting at least two electrodes for making a connection; (b) removing materials covering the electrodes with a focused ion beam (FIB) or a laser to form contact holes for respectively exposing the electrodes; (c) depositing in the contact holes a conductive material for forming electrically conductive piers, by applying the focused ion beam (FIB) or laser, with gas molecules ejected from a nozzle; (d) disposing an electrically conductive viscid material over each of the electrically conductive piers; and (e) disposing an electrically conductive bridge floor to connect with the electrically conductive viscid material to form an electrically conductive bridge.

17 Claims, 9 Drawing Sheets

METHOD FOR MODIFYING CIRCUIT WITHIN SUBSTRATE

BACKGROUND OF THE INVENTION

1. Field of the Invention

The present invention relates to a method for modifying a circuit within a substrate, and more particularly, to a method for modifying an integrated circuit including a plurality of electrodes.

2. Related Prior Arts

Figure 16:
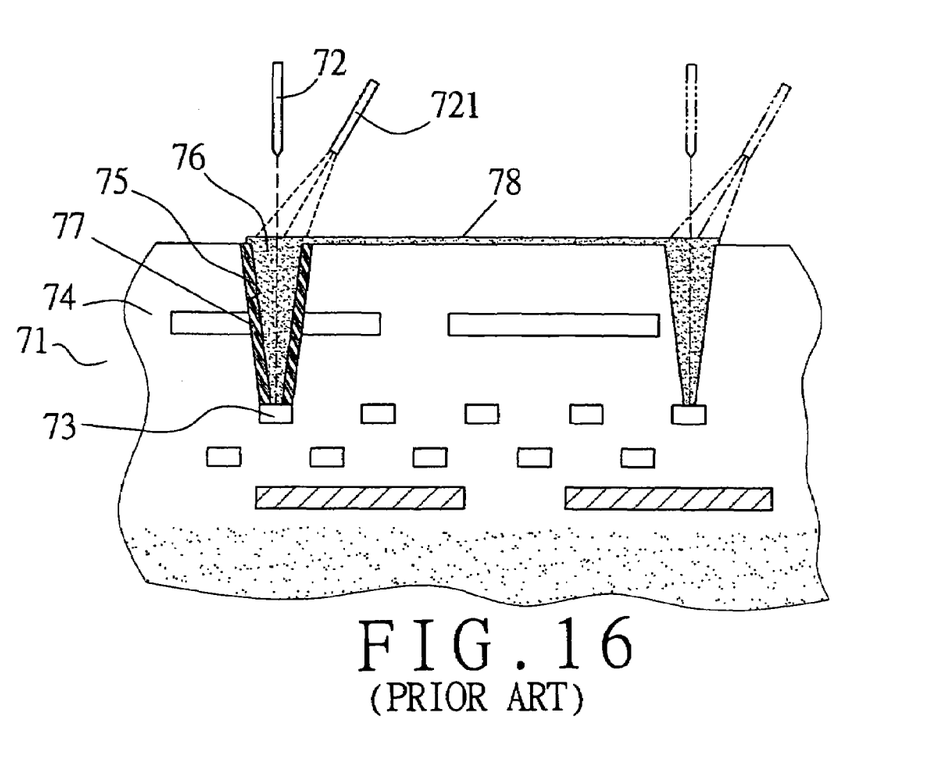
Figure 17:
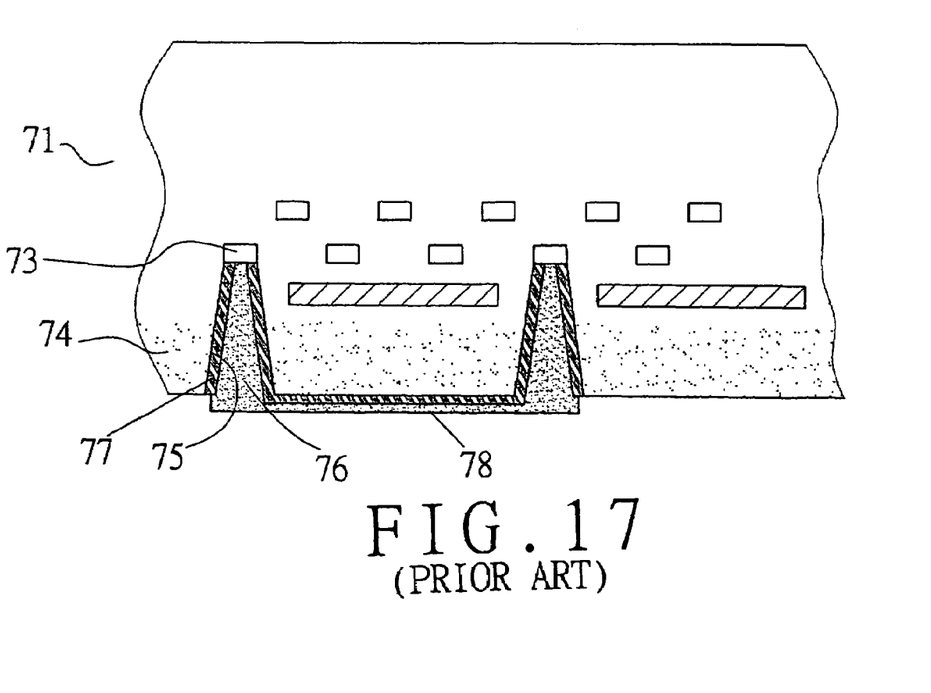

FIGS. 14~17 illustrate the conventional processes for modifying an integrated circuit. First, a layered structure (74) formed on the selected electrode (73) is removed by shooting the focused ion beam (FIB) (72) or the laser beam in order to form a contact hole (75), where the electrode (73) is exposed. The layered structure (74) generally includes conductive layers, semiconductive layers, and insulation layers etc. Then a nozzle (721) ejects gas molecules, with focused ion beam (FIB) (72) or the laser beam, into the contact hole (75), which is further deposited a conductive material to form electrically conductive piers (76). Alternatively, as shown in FIGS. 16 and 17, the insulation film (77) is deposited first on the inner wall of each contact hole (75), and afterwards the electrically conductive pier (76) is formed over the insulation films (77) by the deposition of a conductive material. At last, the conductive piers (76) are adapted to connect with each other via the conductive bridge floor (78), which is formed by depositing the same material with the piers (76). However, such conventional structure has large resistance, particularly for two electrodes distant away from each other and the bridge floor is longer. Therefore, new technologies for reducing resistance are developed.

Van Doorselaer et al. disclosed a method in which plated copper is provided accompanied with chemical vapor deposition, such as focused ion beam, to form a low-resistance wire; referring to "How to Use Cu-Plating for Low Ohmic Long-Distance FIB Connections" published in "20th International Symposium for Testing and Failure Analysis, 1994/11/13-18, pp. 397-405'. By plating copper outside the high-resistance wire formed with the focused ion beam of the chemical vapor deposition, resistance of the wire could be reduced.

U.S. Pat. No. 5,429,994 mentioned a solution in which an electro-less process is applied to deposit an additional conductive material outside a wire formed with the focused ion beam of the chemical vapor deposition.

U.S. Pat. No. 6,692,995 mentioned another method to obtain a low-resistance wire by means of the sputtering or evaporation of the conductive material.

R.O.C. Patent No. 86110359 disclosed a method in which a transparent mask is provided for sputtering or evaporating the conductive material to form a long wire with low resistance.

Though the above methods perform effect in reducing resistance, it takes long time during these complex and unstable processes. As a result, the circuit existed on the chip are easily destroyed and failed.

Besides, while connections between the electrodes of the integrated circuit could be changed by applying the above processes with the FIB, adding additional devices to the integrated circuit is still impossible. Therefore, the need of modifying the integrated circuits remains unsatisfied.

SUMMARY OF THE INVENTION

The present invention provides a method for modifying a circuit within a substrate (for example, an integrated circuit), by using an electrically conductive viscid material and a focused ion beam (FIB) or a laser to form an electrically conductive bridge. The electrically conductive bridge consists of at least two electrically conductive piers, an electrically conductive floor, and the electrically conductive viscid material. The method includes: (a) selecting at least two from the plurality of electrodes for making connection; (b) removing materials covering said selected electrodes with a focused ion beam (FIB) or a laser to form contact holes for respectively exposing said selected electrodes; (c) depositing in said contact holes a conductive material for forming electrically conductive piers by applying said focused ion beam (FIB) or a laser with gas molecules ejected from a nozzle; (d) disposing an electrically conductive viscid material over each of said electrically conductive piers; and (e) disposing an electrically conductive bridge floor to connect with each of the electrically conductive viscid material to form an electrically conductive bridge.

The present invention also provides another method for modifying a circuit within a substrate. The method includes: (a) selecting at least two from the plurality of electrodes for making connection; (b) removing materials covering said selected electrodes with a focused ion beam (FIB) or a laser to form contact holes for respectively exposing said selected electrodes; (b-1) forming insulation film over an inner wall of each contact hole. (c) depositing in said contact holes a conductive material for forming electrically conductive piers by applying said focused ion beam (FIB) or a laser with gas molecules ejected from a nozzle; (d) disposing an electrically conductive viscid material over each of said electrically conductive piers; and (e) disposing an electrically conductive bridge floor to connect with each of the electrically conductive viscid material to form an electrically conductive bridge. In the above step (b-1), an insulation film can be formed over inner, walls of the contact holes, and then the electrically conductive piers are deposited within the insulation films. The bridge floor mentioned in the above step (e) can be any suitable conductive object, for example, directly made from the same electrically conductive viscid material, a conductive wire, or an electronic element.

The present invention provides low cost and simple operations for circuit modification, without vacuum sputtering, evaporation or immersion into electroplating liquid. Therefore, damages caused on the circuit during modification will reduce efficiently.

The present invention thus provides a novel method for easily modifying the circuit, for example, adding an additional device to a circuit. Thus the samples of the product, which are created with lower cost but better quality, can be delivered to the clients in appropriate time.

DETAILED DESCRIPTION OF THE PREFERRED EMBODIMENTS

Though the method of the present invention can be applied to many fields, only preferred embodiments are illustrated herewith. People skilled in the art can understand other embodiments according to the present invention.

Figure 1:
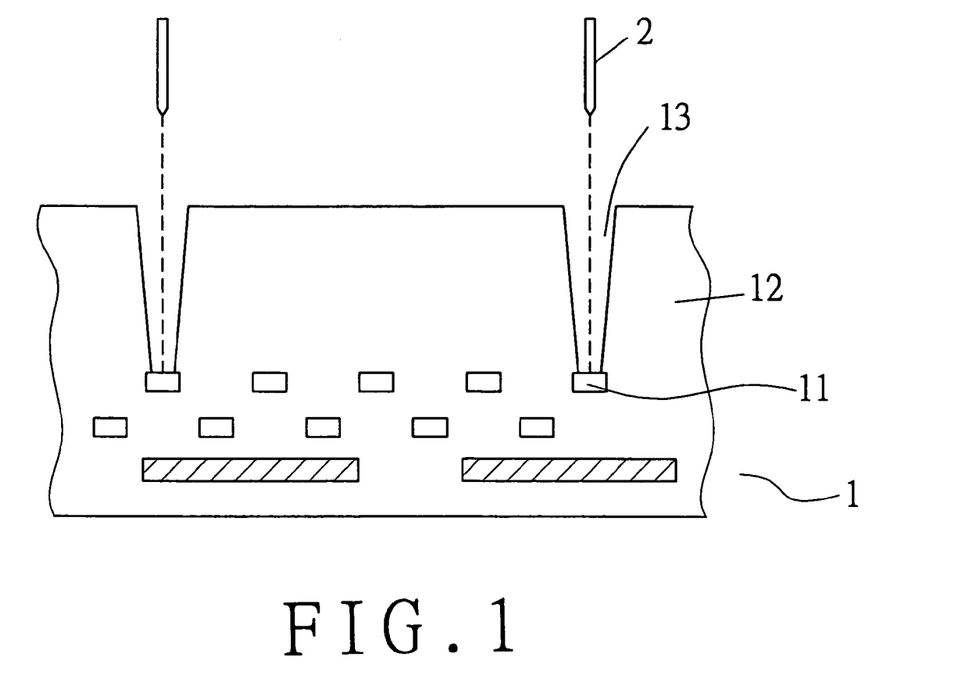
FIG. 1 is a cross section view of the substrate on which the contact hole is formed with the focused ion beam (FIB) according to one embodiment of the present invention.
Figure 2:
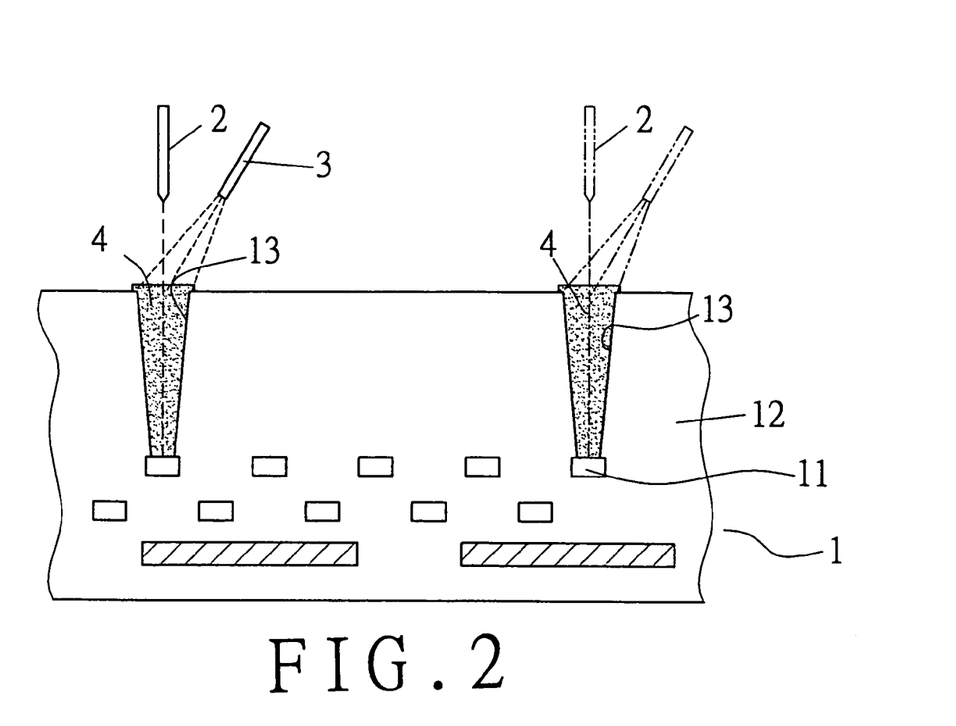
FIG. 2 is a cross section view of the electrically conductive pier, which is made from gas molecules ejected from the nozzle with the FIB according to the embodiment of the present invention.

Referring to the embodiment described in FIG. 1, a substrate (1), such as an integrated circuit, includes a plurality of electrodes (11). At least two of the electrodes (11) are selected for making connection. A layered structure (12) covering the selected electrodes (11) is removed with a focused ion beam (FIB) (2) or a laser beam, to form contact holes (13) and to expose the electrode (11). The layered structure (12) generally includes conductive layers, semiconductive layers, and insulation layers. Then gas molecules ejected from a nozzle (3), with the FIB (2) or the laser beam, are deposited in the contact holes (13) to form electrically conductive piers (4), as shown in FIG. 2. Alternatively, insulation films (not shown in figures) can be previously formed over inner walls of the contact holes (13), and then the electrically conductive piers (4) are deposited on the insulation films.

Figure 3:
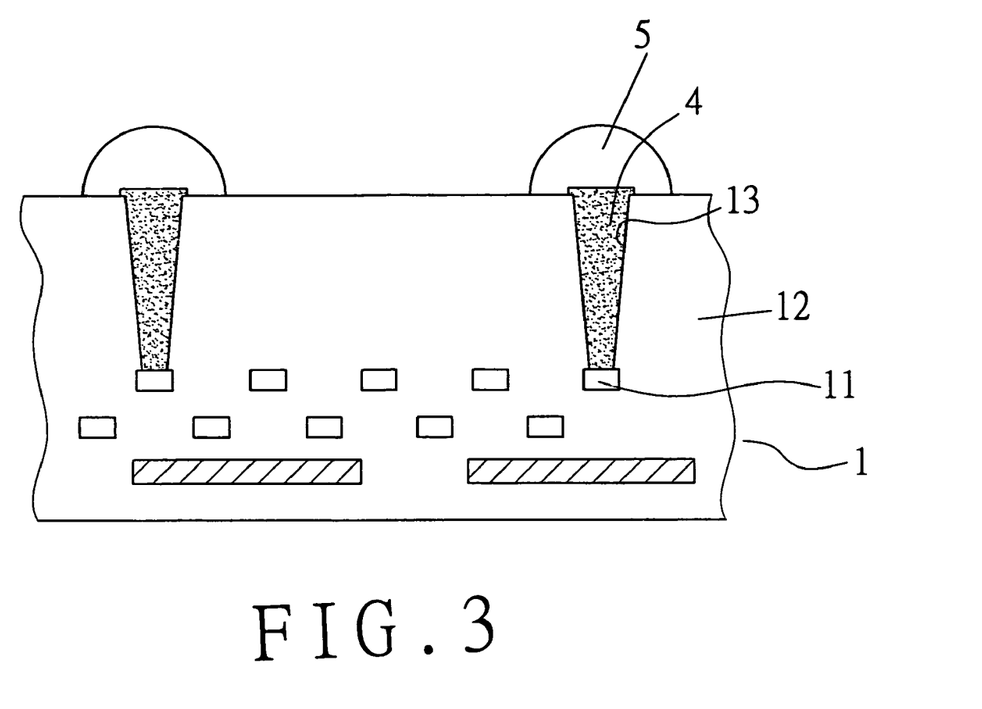
FIG. 3 is a cross section view of the electrically conductive viscid material, which is placed on the electrically conductive pier according to the embodiment of the present invention.
Figure 4:
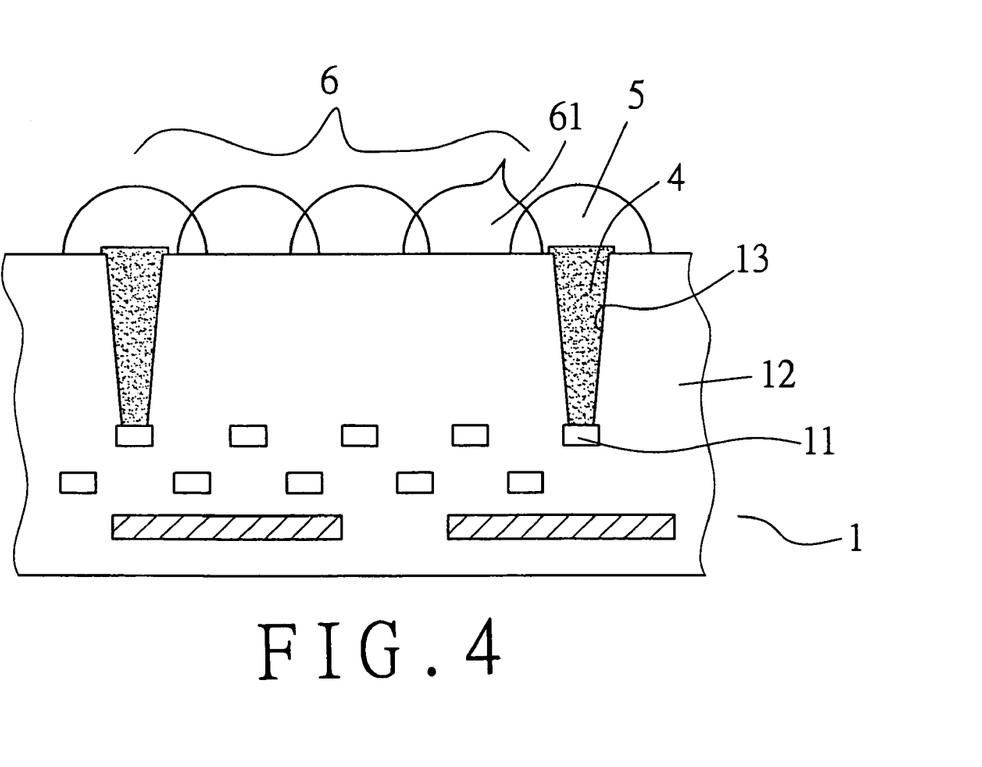
FIG. 4 is a cross section view of the application according to the embodiment of the present invention, in which the plurality of electrically conductive viscid materials is connected with the two electrically conductive piers.

Referring to FIG. 3, it describes the embodiment in of the present invention, in which an electrically conductive viscid material (5) such as a conductive glue, is placed over the electrically conductive piers (4). Referring to FIG. 4, the electrically conductive viscid material (5) is further adapted to connect with a plurality of the electrically conductive viscid material (61) to form an electrically conductive bridge (6)

Figure 5:
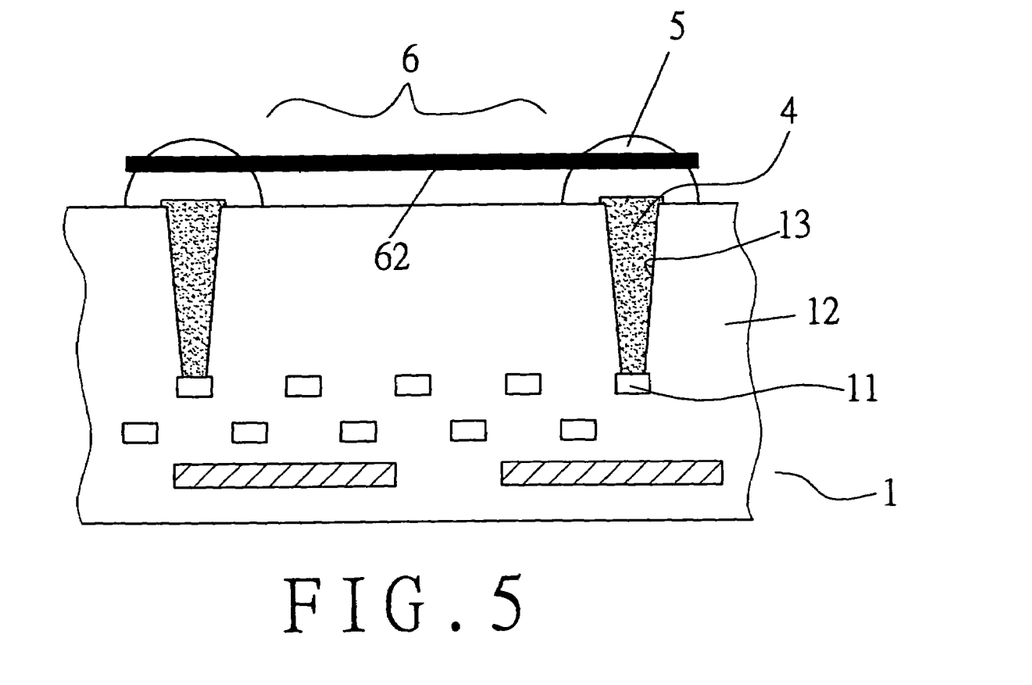
FIG. 5 is a cross section view of the application according to another embodiment of the present invention, in which conductive wire is connected with two electrically conductive piers via the electrically conductive viscid material.

Referring to the embodiment described in FIG. 5, the electrically conductive viscid material (5) is adapted to connect with a conductive wire (62), to form an electrically conductive bridge (6).

Figure 6:
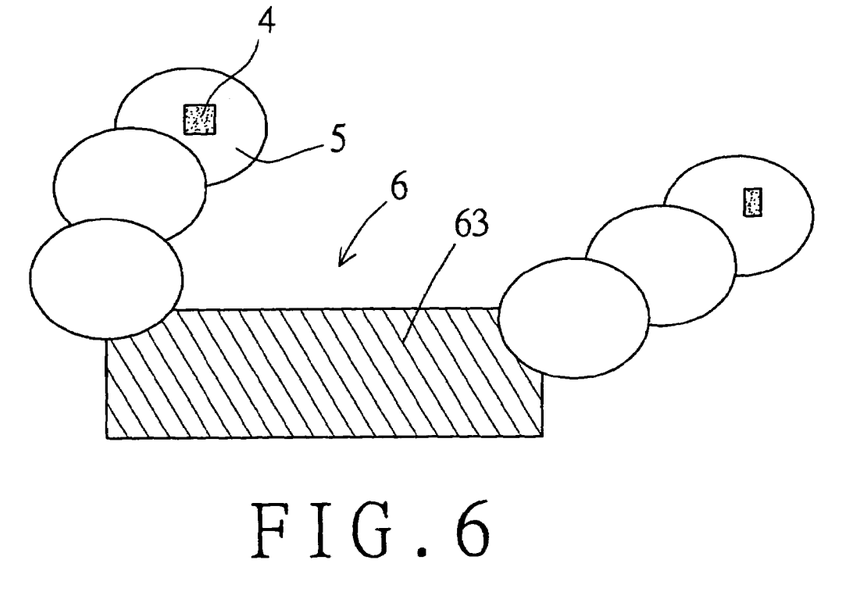
FIG. 6 is a top view of the application according to another embodiment of the present invention, in which plurality of the electrically conductive viscid material forming electrically conductive paths are adapted to connect with an electronic element to form an electrically conductive bridge.

Referring to the embodiment described in FIG. 6, plurality of the electrically conductive viscid material (5) forming electrically conductive paths are adapted to connect with an electronic element (63) to form an electrically conductive bridge (6).

Figure 7:
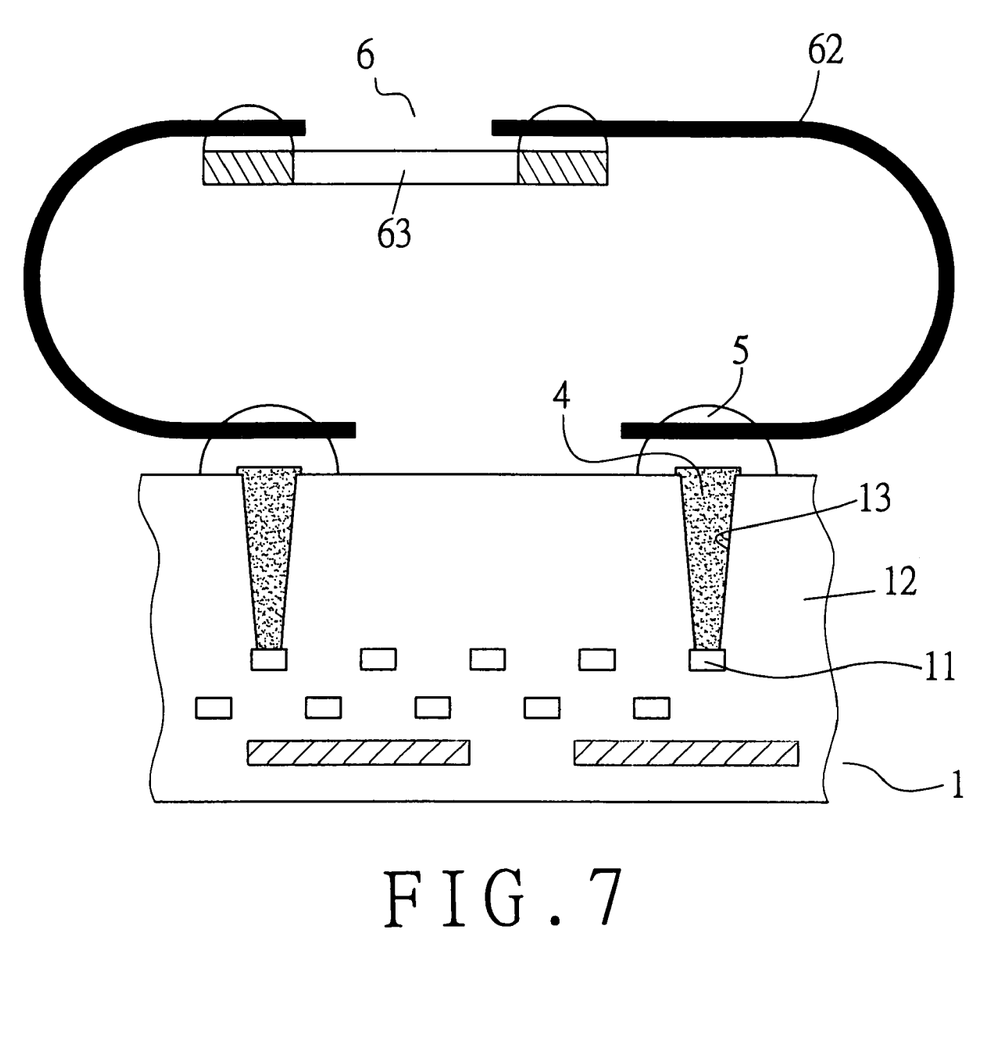
FIG. 7 is a cross section view of the application according to another embodiment of the present invention, in which two conductive wires and an additional electronic element are connected with the two electrically conductive piers via the electrically conductive viscid material.

Referring to the embodiment described in FIG. 7, the electrically conductive viscid material (5) is adapted to connect with both the electronic element (63) and the wire (62) simultaneously to form an electrically conductive bridge (6), to facilitate adding an additional element (63) for circuit modification.

Figure 8:
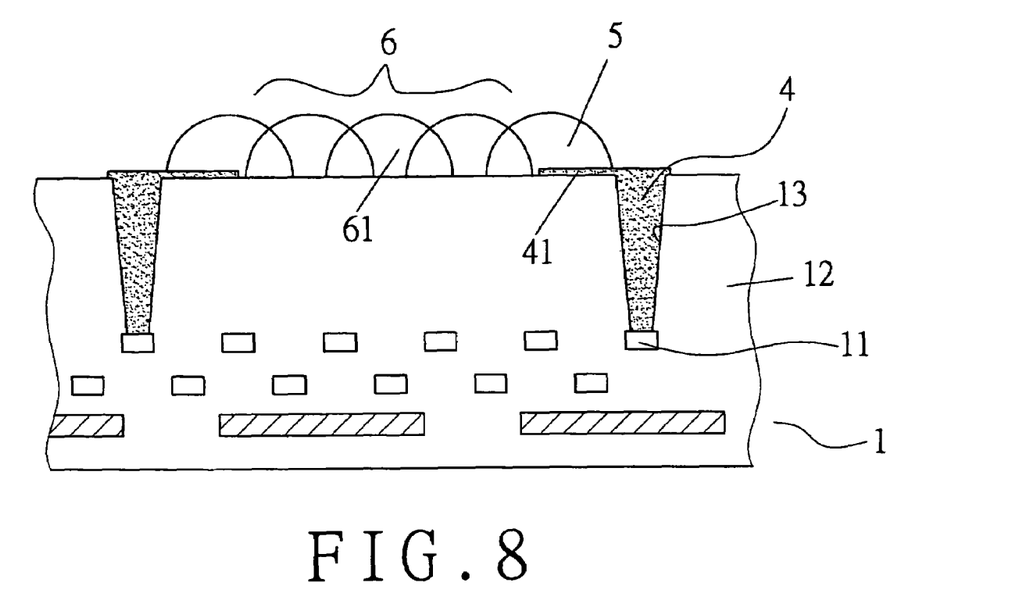
FIGS. 8~10 illustrate embodiments similar to those in FIGS. 4~6, wherein the electrically conductive piers further comprise respective lateral segments.
Figure 9:
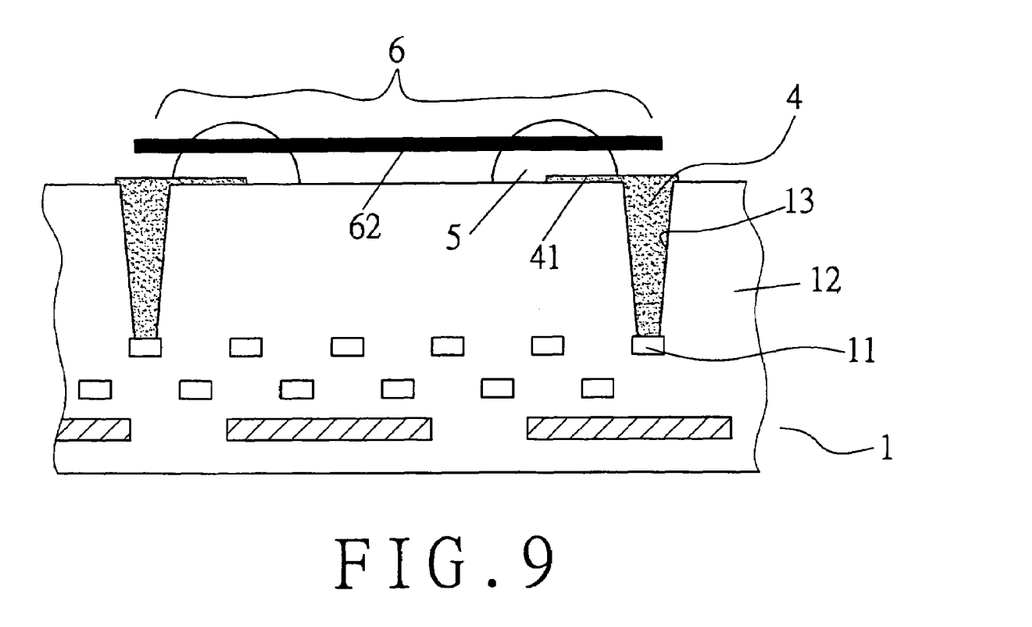
Figure 10:
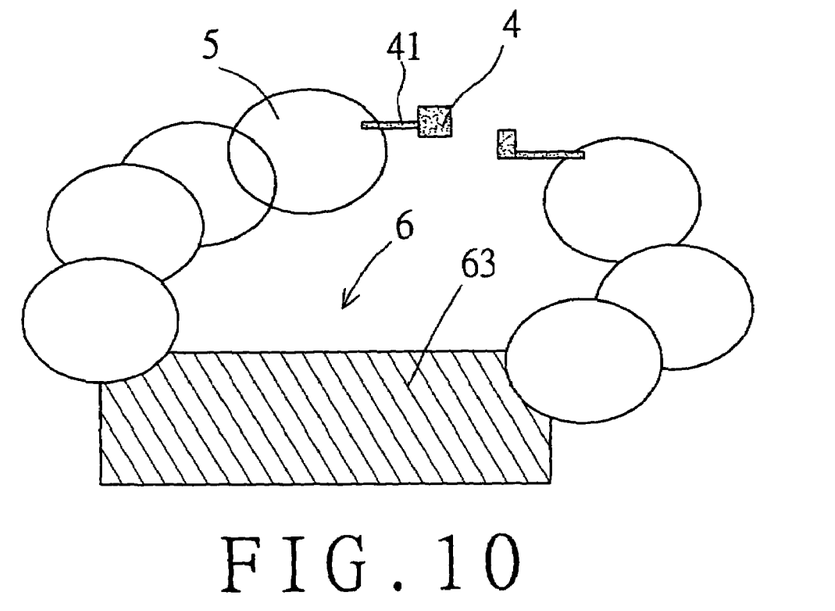

The embodiments described in FIGS. 8~10 are similar to those in FIGS. 4~6. Referring to the embodiment described in FIG. 8, the electrically conductive piers (4) respectively stretch the lateral segments (41) from top edges thereof and over the layered structure (12). The lateral segments (41) are also made from the same material as the electrically conductive piers (4) and can be further adapted to connect with the electrically conductive bridge floor (6), which is made of the plurality of electrically conductive viscid material (61), through the electrically conductive viscid material (5).

Referring to the embodiment described in FIG. 9, the lateral segments (41) are also made from the same material as the electrically conductive piers (4) and can be adapted to connect with the conductive wire (62), through the electrically conductive viscid material (5).

Referring to the embodiment described in FIG. 10, the lateral segments (41) are also made from the same material as the electrically conductive piers (4) and can be adapted to connect with the electronic element (63), such as an active or a passive component, through the plurality of the electrically conductive viscid material (5). Accordingly, an electrically conductive bridge (6) can be built, or an additional element (63) can be added to the existed circuit for circuit modification.

Figure 11:
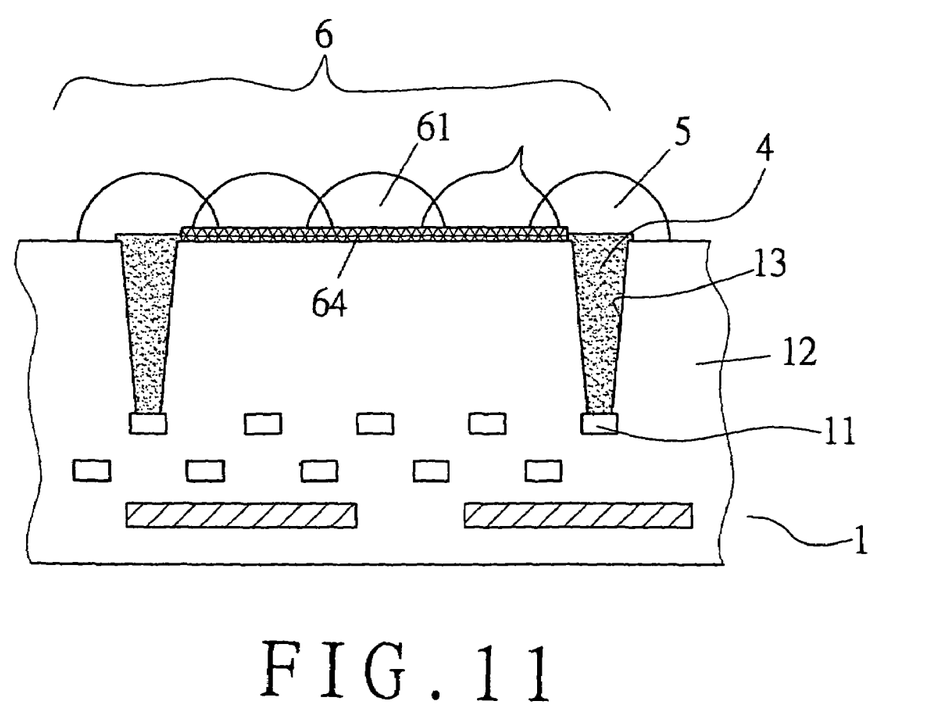
FIGS. 11~13 also illustrate embodiments similar to those in FIGS. 4~6, wherein insulation components are arranged beneath the electrically conductive bridge floors.
Figure 12:
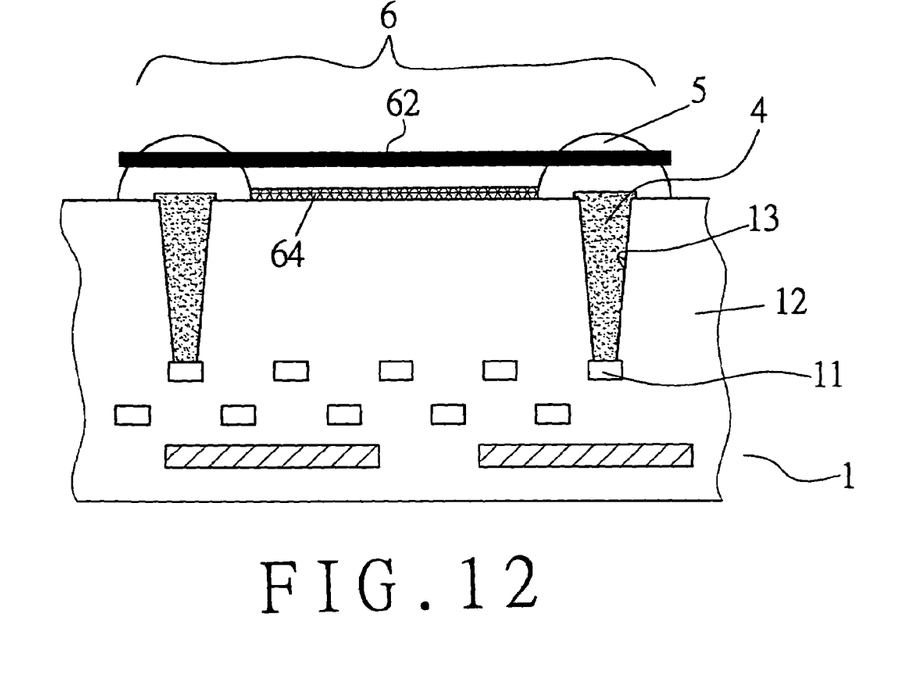
Figure 13:
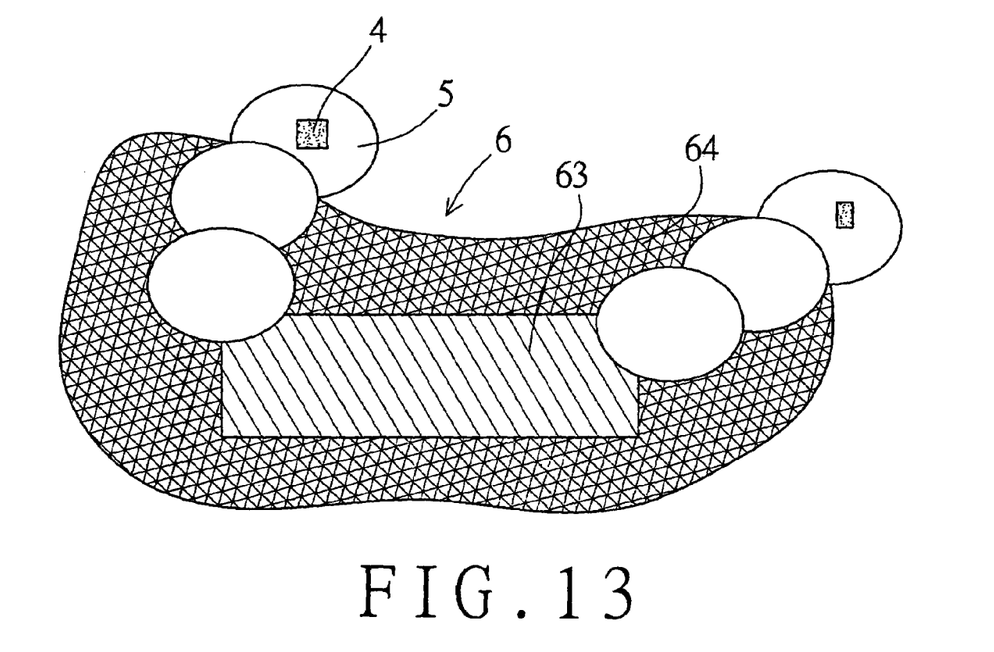
Figure 14:
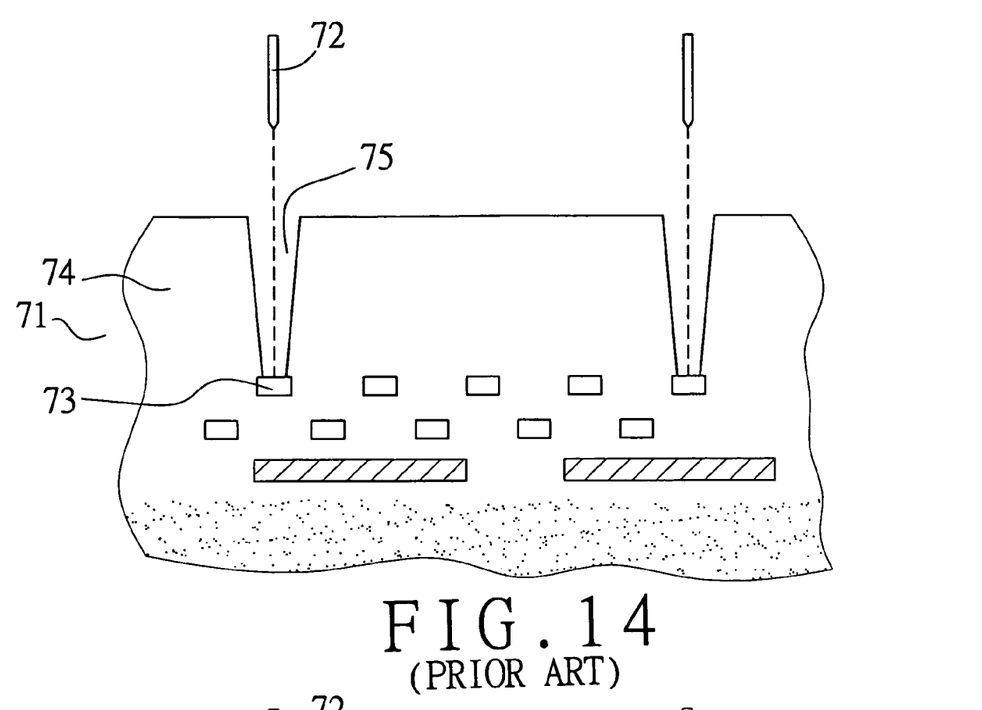
FIG. 14 is a cross section view of the substrate on which the contact hole is formed with the FIB according to the conventional process.
Figure 15:
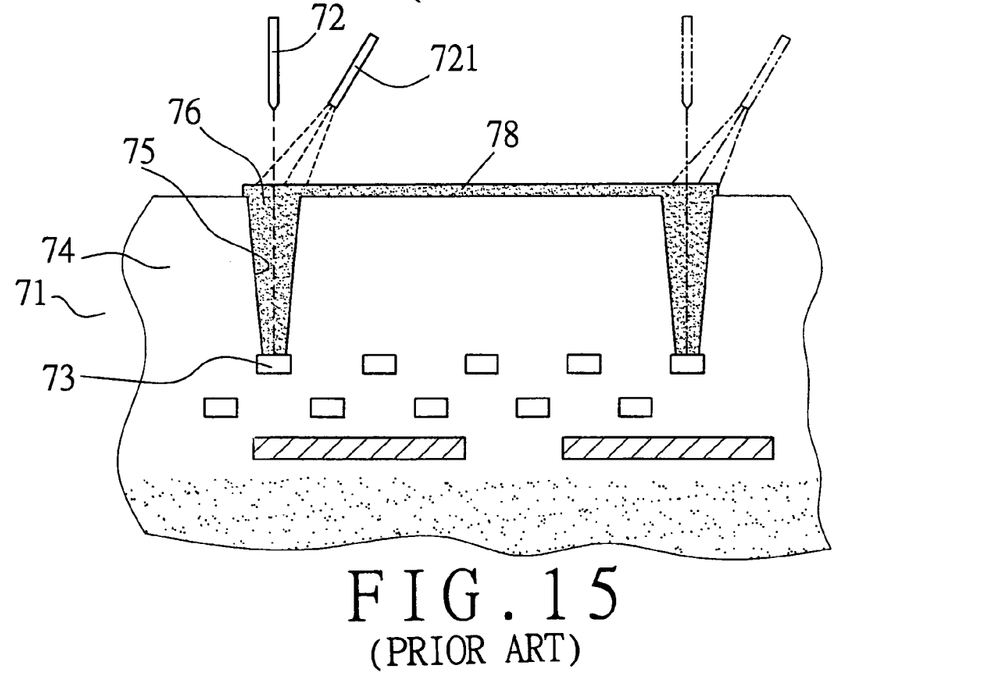
FIGS. 15~17 are cross section views of the electrically conductive bridge which is made from gas molecules ejected from a nozzle with the FIB according to the conventional process.

The embodiments described in FIGS. 11~13 are also similar to those in FIGS. 4~6. In FIGS. 11~13, components (64) made from an insulation material such as insulation glue, $SiO_2$, etc., are arranged beneath the electrically conductive bridge floors (6), whereby better electrical effect can be achieved.

In addition to the electrically conductive piers formed with the focused ion beam or the laser beam, the present invention constructs an electrically conductive bridge by the electrically conductive viscid material and the associated electrically conductive bridge floor. Therefore, resistance and cost can be effectively reduced, and the process is easily operated without damage due to ion bombardment, comparing with conventional methods.

It should be noted that the above is merely to illustrate the preferred embodiment of the present invention, but not limited to the scope thereof. Other embodiments may be devised without departing from the spirit of the inventions and the scope of the appended claims.

What is claimed is:

1. A method for modifying a circuit within a substrate, the circuit including a plurality of electrodes, the method comprising steps of:
   (a) selecting at least two from the plurality of electrodes for making an electrical connection between the at least two electrodes;
   (b) removing materials covering said selected electrodes with a focused ion beam (FIB) to form contact holes for respectively exposing said selected electrodes;
   (c) depositing in said contact holes a conductive material for forming electrically conductive piers by applying said focused ion beam (FIB) and gas molecules ejected from a nozzle;

(d) disposing an electrically conductive viscid material selectively over each of said electrically conductive piers, thereby forming discrete electrical connections between only said electrically conductive piers; and (e) disposing an electrically conductive bridge floor to connect with each of the electrically conductive viscid material to form an electrically conductive bridge.

2. The method as claimed in claim 1, wherein said circuit is in form of integrated circuit (IC).

3. The method as claimed in claim 1, wherein said circuit is in form of printed circuit board (PCB).

4. The method as claimed in claim 1, further comprising a following step between the step (b) and (c): (b-1) forming insulation film over an inner wall of each contact hole.

5. The method as claimed in claim 1, wherein said electrically conductive viscid material is a conductive glue.

6. The method as claimed in claim 1, wherein said bridge floor is formed by multiple beads of electrically conductive viscid material.

7. The method as claimed in claim 1, wherein said bridge floor is a conductive wire.

8. The method as claimed in claim 1, wherein said bridge floor is a combination of multiple beads of electrically conductive viscid material and an electronic element.

9. The method as claimed in claim 1, wherein said bridge floor is a combination of at least one conductive wire and an electronic element.

10. The method as claimed in claim 1, wherein said electrically conductive pier comprises a lateral segment of the same material at a top edge of the conductive pier.

11. The method as claimed in claim 1, wherein an insulation component is provided beneath said bridge floor.

12. The method as claimed in claim 11, wherein said insulation component is an insulation glue.

13. A method for modifying a circuit within a substrate, the circuit including a plurality of electrodes, the method comprising steps of:

(a) selecting at least two from the plurality of electrodes for making an electrical connection between the at least two electrodes;

(b) removing materials covering said selected electrodes with a laser to form contact holes for respectively exposing said selected electrodes;

(c) depositing in said contact holes a conductive material for forming electrically conductive piers by applying said laser and gas molecules ejected from a nozzle;

(d) disposing an electrically conductive viscid material selectively over each of said electrically conductive piers, thereby forming discrete electrical connections between only said electrically conductive piers; and (e) disposing an electrically conductive bridge floor to connect with each of the electrically conductive viscid material to form an electrically conductive bridge.

14. The method as claimed in claim 13, wherein said circuit is in form of integrated circuit (IC).

15. The method as claimed in claim 13, wherein said circuit is in form of printed circuit board (PCB).

16. The method as claimed in claim 13, further comprising a following step between the step (b) and (c) including the steps of forming insulation film over an inner wall of each contact hole.

17. The method as claimed in claim 13, wherein said electrically conductive viscid material is a conductive glue.

* * * * *